(12) United States Patent  
Yang

(10) Patent No.: US 11,340,294 B2
(45) Date of Patent: May 24, 2022

(54) BOUNDARY TEST CIRCUIT, MEMORY AND BOUNDARY TEST METHOD

(71) Applicant: Changxin Memory Technologies, Inc., Anhui (CN)

(72) Inventor: Cheng-Jer Yang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/165,831

(22) Filed: Feb. 2, 2021

(65) Prior Publication Data

US 2021/0156913 A1 May 27, 2021

Related U.S. Application Data

(63) Continuation of application No. PCT/CN2019/102123, filed on Aug. 23, 2019.

(30) Foreign Application Priority Data

Aug. 28, 2018 (CN) .......................... 201810986092.3
Aug. 28, 2018 (CN) .......................... 201821397094.0

(51) Int. Cl.
*G01R 31/3177* (2006.01)
*G11C 7/22* (2006.01)
(Continued)

(52) U.S. Cl.
CPC .......... *G01R 31/3177* (2013.01); *G01R 29/18* (2013.01); *G01R 31/2841* (2013.01);
(Continued)

(58) Field of Classification Search
CPC .. G01R 29/18; G01R 31/2841; G01R 31/317; G01R 31/31727; G01R 31/3177;
(Continued)

(56) References Cited

U.S. PATENT DOCUMENTS 5,648,973 A 7/1997 Mote, Jr.
6,671,847 B1 * 12/2003 Chao ................ G01R 31/31715
714/731
(Continued)

FOREIGN PATENT DOCUMENTS

CN 102419415 A 4/2012
CN 107340467 A 11/2017
(Continued)

OTHER PUBLICATIONS

PCT International Search Report and the Written Opinion dated Nov. 7, 2019, issued in related International Application No. PCT/CN2019/102123 (8 pages).

*Primary Examiner* — April Y Blair
*Assistant Examiner* — Sazzad Hossain
(74) *Attorney, Agent, or Firm* — Sheppard Mullin Richter & Hampton LLP

(57) ABSTRACT

Boundary test circuit, memory and boundary test method are provided. The boundary test circuit may include a plurality of serially-connected wrapper boundary registers (WBRs) and a plurality of toggle circuits (TCs). Each WBR may include a first I/O for receiving an initial test signal and a second I/O for transmitting the initial test signal to the WBR at a succeeding stage. Each TC may include an input for receiving the initial test signal stored in a corresponding WBR, a control I/O for receiving a toggle signal, and an output for transmitting a real-time test signal to the integrated circuit. The toggle signal may be configured to control phase switching of the real-time test signal, and, depending on the toggle signal, the real-time test signal may have a phase identical or inverse to a phase of the initial test signal. This method improves the efficiency and flexibility of the boundary test.

13 Claims, 2 Drawing Sheets

(51) Int. Cl.
*G01R 31/317* (2006.01)
*G11C 29/12* (2006.01)
*G11C 7/10* (2006.01)
*G01R 31/28* (2006.01)
*G01R 29/18* (2006.01)
*G01R 31/3187* (2006.01)

(52) U.S. Cl.
CPC ........ *G01R 31/317* (2013.01); *G01R 31/3187* (2013.01); *G01R 31/31727* (2013.01); *G11C 7/1078* (2013.01); *G11C 7/1087* (2013.01); *G11C 7/222* (2013.01); *G11C 7/225* (2013.01); *G11C 29/1201* (2013.01); *G11C 29/12015* (2013.01)

(58) Field of Classification Search
CPC ............ G01R 31/3187; G11C 29/1201; G11C 7/222; G11C 29/12015; G11C 7/1078; G11C 7/1087; G11C 7/225
See application file for complete search history.

(56) References Cited

U.S. PATENT DOCUMENTS

| | | | |
|---|---|---|---|
| 2005/0110526 A1* | 5/2005 | Ishibashi | G01R 31/50 327/18 |
| 2008/0244343 A1 | 10/2008 | Grealish et al. | |
| 2010/0100781 A1* | 4/2010 | Wohl | G01R 31/3177 714/728 |
| 2014/0046616 A1* | 2/2014 | Cheng | G01R 31/31725 702/120 |
| 2015/0338461 A1* | 11/2015 | Wang | G01R 31/3177 714/727 |

FOREIGN PATENT DOCUMENTS

| | | |
|---|---|---|
| CN | 109192240 A | 1/2019 |
| CN | 208596549 U | 3/2019 |

* cited by examiner

BOUNDARY TEST CIRCUIT, MEMORY AND BOUNDARY TEST METHOD

CROSS-REFERENCE TO RELATED APPLICATION

This application is a continuation application of International Patent Application No. PCT/CN2019/102123, filed on Aug. 23, 2019, which is based on and claims priority of the Chinese Patent Application No. 201810986092.3, filed on Aug. 28, 2018 and entitled "BOUNDARY TEST CIRCUIT, MEMORY AND BOUNDARY TEST METHOD." The above-referenced application is incorporated herein by reference in its entirety.

TECHNICAL FIELD

This invention relates generally to the technical field of electronics, and more specifically, to a boundary test circuit, memory and boundary test method.

BACKGROUND

In modern electronic system, with the technology advancements in large-scale integrated circuit and manufacturing technologies, printed circuit boards are increasingly becoming smaller, denser and thinner. With the number and the density of pins on a device continuously increasing, conventional "probe" test methods that test a chip using a multimeter and an oscilloscope are unable to meet the demand.

Boundary scan test is an emerging test method. A boundary scan test may be implemented by adding a boundary scan cell (BSC) on each I/O pin of a chip along with some additional test control logics. Each of the BSCs may be composed of registers, and each I/O pin of the chip may correspond to a BSC. Each BSC may include two data channels, one of which is a test data channel for test data input (TDI) and test data output (TDO), and the other is a normal data channel for normal data input (NDI) and normal data output (NDO).

In an existing boundary test circuit, in a test mode, the test data is sequentially transmitted at each clock cycle, and the data of each BSC is output to a to-be-tested integrated circuit via the I/O pins. Different test vectors may first need to be input to all BSCs before they can be output to the to-be-tested integrated circuit. As a result, conventional boundary test circuits have low efficiency and poor flexibility. Therefore, a boundary test circuit and related method that can address at least some of the aforementioned limitations are desired.

The information disclosed in the Background section is for facilitating the understanding on the background of the invention and therefore may include information that does not constitute prior art already known to a person of ordinary skills in the art.

SUMMARY

To address the limitations of conventional technologies described above, this disclosure provides a boundary test circuit, a memory and a boundary test method.

One aspect of this disclosure is directed to a boundary test circuit for testing an integrated circuit. The boundary test circuit may include a plurality of serially-connected wrapper boundary registers (WBRs) and a plurality of toggle circuits (TCs). Each WBR may include a first I/O for receiving an initial test signal, and a second I/O for transmitting the initial test signal to the WBR at a succeeding stage. Each TC may include an input for receiving the initial test signal stored in a corresponding WBR, a control I/O for receiving a toggle signal, and an output for transmitting a real-time test signal to the integrated circuit. A phase of the real-time test signal may be either identical or inverse to a phase of the initial test signal.

In some embodiments, in the aforementioned circuit, the toggle signal may be configured to control phase switching of the real-time test signal.

In some embodiments, in the aforementioned circuit, each TC may include a NOT gate and a first data selector. The NOT gate may include an input for receiving the initial test signal stored in a WBR, and the first data selector may include a first input for receiving the initial test signal, a second input connected to an output of the NOT gate, a control I/O for receiving the toggle signal, and an output for transmitting the real-time test signal.

In some embodiments, in the aforementioned circuit, each TC comprises a first register, an OR gate, an XOR gate, and a second data selector. The first register may include an input for receiving the initial test signal stored in a WBR. The OR gate may include a first input connected to an output of the first register, and a second input for receiving the toggle signal. The XOR gate may include a first input connected to the output of the first register, and a second input for receiving the toggle signal. The second data selector may include a first input connected to an output of the OR gate, a second input connected to an output of the XOR gate, a control I/O for receiving the toggle signal, and an output for transmitting the real-time test signal.

In some embodiments, in the aforementioned circuit, each TC may be configured to transmit the real-time test signal under the control of a CLK signal.

In some embodiments, in the aforementioned circuit, each WBR may include a third data selector, a second register, and a fourth data selector. The third data selector may include a first input for receiving the initial test signal, and a control I/O for receiving a Hold signal. The second register may include an input connected to an output of the third data selector, and an output for outputting the initial test signal stored in the second register. The fourth data selector may include a first input for receiving a Normal input, a second input connected to the output of the second register, a control I/O for receiving a Scan signal, and an output for transmitting the Normal output. The output of the fourth data selector may be connected to a second input of the third data selector.

In some embodiments, in the aforementioned circuit, each WBR may be configured to transmit the initial test signal under the control of a CLK signal.

In some embodiments, the integrated circuit may be a memory.

This inventive concept further provides a memory having a boundary test circuit. The boundary test circuit may be configured to test the memory.

This inventive concept further provides a boundary test method for testing an integrated circuit. The test method may include receiving, by each wrapper boundary register (WBR) in a plurality of serially-connected WBRs, an initial test signal, and receiving, by each toggle circuit (TC) in a plurality of TCs, the initial test signal stored in a corresponding WBR. Each WBR may transmit the initial test signal to the WBR at a succeeding stage, and the TC may transmit a real-time test signal to the integrated circuit according to a toggle signal. A phase of the real-time test signal may be either identical or inverse to a phase of the initial test signal.

In some embodiments, in the aforementioned test method, the toggle signal may be configured to control phase switching of the real-time test signal.

In some embodiments, the aforementioned test method may further comprise receiving, by each TC in the plurality of TCs, a CLK signal, and each TC may transmit the real-time test signal under the control of the CLK signal.

In some embodiments, the aforementioned test method may further comprise receiving, by each WBR in the plurality of WBRs, a CLK signal, and each WBR may transmit the initial test signal under the control of the CLK signal.

In the boundary test circuits in according to the embodiments of this inventive concept, TCs added to the boundary test circuits may control phase switching of the read-time test signal output by each WBR. Thus each WBR may provide either an original signal or an inversed signal to the to-be-tested integrated circuit at different clock cycles. Therefore, the boundary test circuit can provide improved test efficiency and test flexibility.

It is to be understood that both the foregoing general description and the following detailed description are exemplary and explanatory only and are not necessarily restrictive to the present invention.

BRIEF DESCRIPTION OF THE DRAWINGS

The accompanying drawings, which are incorporated in and constitute a part of the description, illustrate embodiments in accordance with this disclosure and, together with the description, serve to explain the disclosed inventive concept. It is apparent that these drawings present only some embodiments of the inventive concept and persons of ordinary skill in the art may obtain drawings of other embodiments from them without creative effort.

NUMERALS IN THE DRAWINGS

Figure 1:
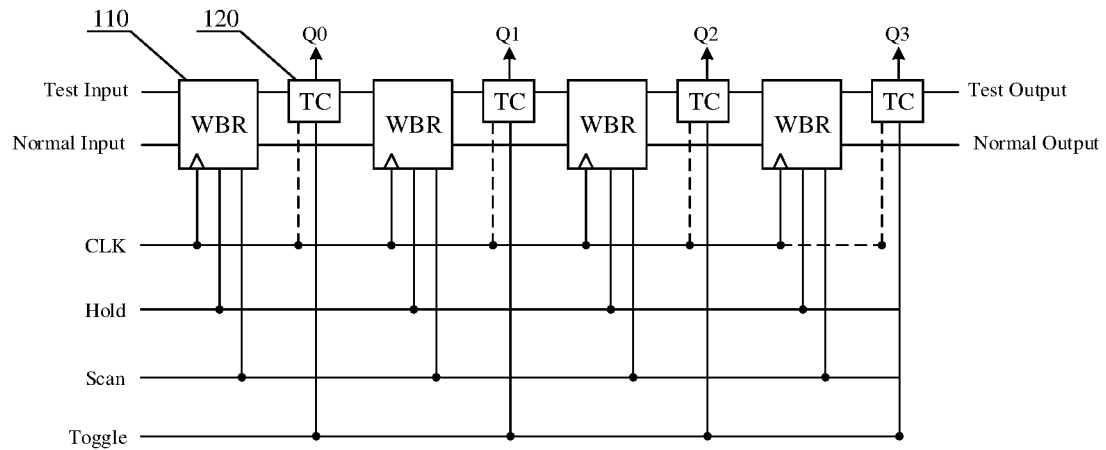
FIG. 1 is a schematic diagram of a boundary test circuit in accordance with one embodiment of this inventive concept.

110—wrapper boundary register (WBR);
120—toggle circuit (TC);
210—NOT gate;
220—first data selector;
230—third data selector;
240—second register;
250—fourth data selector;
310—first register;
320—OR gate;
330—exclusive-OR gate;
340—second data selector.

DETAILED DESCRIPTION OF THE EMBODIMENTS

The embodiments will be described thoroughly and completely with reference to the accompanying drawings. However, the embodiments can be implemented in various forms, and should not be understood as being limited to the embodiments described herein. Instead, these embodiments are provided to make the present invention thorough and complete, and to fully convey the concepts of the embodiments to those skilled in the art. Identical numerals in the drawings represent an identical or similar structure and thus the detailed descriptions thereof are omitted.

Although relative terms are used in the specification, for example, "on" and "under" are used to describe a relative relationship of one numeral component to another component, these terms used in the specification are merely for the convenience, for instance, according to an exemplary direction in the drawings. It is to be understood that if a numeral apparatus is inversed to turn upside down, a component described to be "on" will become a component to be "under". When a structure is "on" other structure, it may be indicated that the structure is integrally formed on the other structure, or indicated that the structure is "directly" disposed on the other structure, or indicated that the structure is "indirectly" disposed on the other structure via another structure.

Terms "a", "an", "one", "the", "said" and "at least one" are used to represent one or more elements/compositional portions etc. Terms "include", "including", "comprise", "comprising", "has" and "having" are used to represent a meaning of open inclusion and refer to that another elements/compositional portions etc. may further be present besides the listed elements/compositional portions etc. The terms "first", "second", "third" etc. are merely used as numerals rather than limits to the number of objects thereof.

In an embodiment of this inventive concept, a boundary test circuit, configured to test an integrated circuit, is provided. The to-be-tested integrated circuit may be an independent chip that is encapsulated, and may also be a partial circuit unit that is not encapsulated into a chip. More specifically, in some embodiments, the integrated circuit may be a memory. When the to-be-tested integrated circuit is an independent chip, the boundary test circuit may be connected to I/O pins of the chip and perform data transmission. When the to-be-tested integrated circuit is an unencapsulated circuit unit, the boundary test circuit may be connected to a data channel of the circuit unit or a node for transmitting data, and perform data transmission. The detail composition and configuration of the to-be-tested integrated circuit is not specially limited in this inventive concept.

FIG. 1 is a schematic diagram of a boundary test circuit in accordance with one embodiment of this inventive concept. Referring to FIG. 1, the boundary test circuit may include a plurality of wrapper boundary registers (WBRs) 110 and a plurality of toggle circuits (TCs) 120. Each WBR 110 may be composed of registers, and each TC 120 may be configured to control of a state of a test signal.

In some embodiments, the WBRs 110 and the TCs 120 may be arranged sequentially and alternately, and may be serially connected stage by stage to form a complete test circuit. The number of the WBRs 110 may be the same as the number of the TCs 120, and each WBR 110 and each TC 120 may form into a one-to-one corresponding connection relationship. In some embodiments, any other connection modes may be adopted by each WBR 110 and each TC 120. In addition, the number of the WBRs 110 may also be different with the number of TCs 120. The connection relationship and numerical relationship of the WBRs 110 and the TCs 120 may be set according to the characteristics of the to-be-tested integrated circuit and actual test requirements, which are not specially limited in this disclosure.

Each WBR 110 may include a first I/O (Test Input) and a second I/O (Test Output). The first I/O (Test Input) may be configured to receive an initial test signal, and the second I/O (Test Output) may be configured to transmit the received initial test signal to a WBR 110 at a succeeding stage. The first I/O (Test Input) of a first-stage WBR 110 may be located at an initial end of the boundary test circuit and may be connected to a test instrument that sends the initial test signal. The second I/O (Test Output) of a last-stage WBR 110 may be located at a last end of the boundary test circuit and may also be connected to the test instrument that sends the initial test signal, thus forming a complete test loop. When a current stage WBR 110 transmits the initial test signal to a next stage WBR 110, the test signal may be directly transmitted to the next stage WBR 110 via a data channel between these two WBRs 110. Alternatively, the test signal may go through a TC between these two WBRs and be indirectly transmitted to the next stage WBR 110. The manner of test signal transmission between two WBRs 110 is not specially limited in this disclosure.

Referring to FIG. 1, each TC 120 may include an input for receiving the initial test signal stored in a corresponding WBR 110, a control I/O for receiving a toggle signal, and an output (e.g., Q0, Q1, Q2, Q3 shown in FIG. 1) for transmitting a real-time test signal to the to-be-tested integrated circuit. A phase of the real-time test signal may be identical to a phase of the initial test signal, and may also be an inverse of the phase of the initial test signal. The real-time test signal may, under the control of the received toggle signal, go through phase switching to obtain one of two states: one having a phase same as the phase of the initial test signal while the other having a phase inverse to the phase of the initial test signal. Additionally, the real-time test signal transmitted by each TC 120 may also go through the phase switching under the control of a CLK signal or any other trigger signal, which is not specially limited in this disclosure.

In the boundary test circuit of this embodiment, a plurality of TCs are added to the boundary test circuit. Each of the TCs may perform state switching (phase switching) on a real-time test signal output by each WBR, and, under the control of a relevant control signal, either an original test signal or an inversed test signal (a signal that has an inversed phase with the original test signal) can be output to the to-be-tested integrated circuit at different clock cycles. Therefore, the boundary test circuit can provide improved test efficiency and test flexibility.

The compositional components and test principles of the WBR 110 and the TC 120 will be described below with reference to FIGS. 2 and 3.

Figure 2:
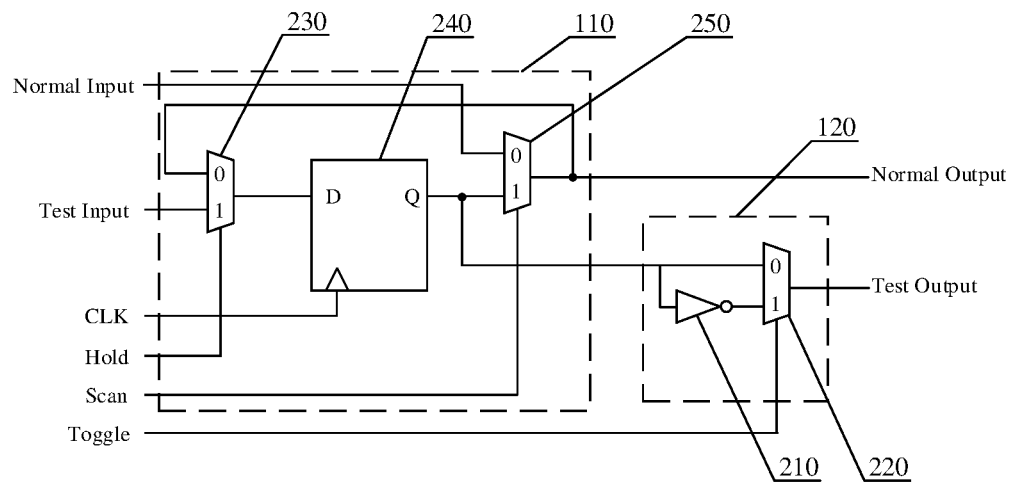
FIG. 2 is a schematic diagram of a part of a boundary test circuit in accordance with one embodiment of this inventive concept.

Referring to FIG. 2, in some embodiments, a TC 120 may include a NOT gate 210 and a first data selector 220. An input of the NOT gate 210 may be configured to receive the initial test signal stored in a corresponding WBR 110.

The first data selector 220 may include a first input, a second input, a control I/O and an output. A first input of the first data selector 220 may be connected to a same node as the input of the NOT gate 210, and may also be configured to receive the initial test signal stored in a corresponding WBR 110, a second input of the first data selector 220 may be connected to an output of the NOT gate 210, and may be configured to receive an output signal of the NOT gate 210. The control I/O of the first data selector 220 may be configured to receive a toggle signal, which may control a state selection of the first data selector 220. The output of the first data selector 220 may be configured to transmit a real-time test signal, which may be selected, based on the toggle signal received from the control I/O, from one of the two inputs of the first data selector 220.

For example, when the toggle signal is a first signal (e.g., a high level), the first data selector 220 may select the signal at the second input, thus the real-time test signal at the output of the first data selector 220 may have a phase that is inverse to the phase of the initial test signal. When the toggle signal is a second signal (e.g., a low level), the first data selector 220 may select the signal at the first input, thus the real-time test signal at the output of the first data selector 220 may have a phase that is identical to the phase of the initial test signal.

It is to be noted that the compositional components of a TC 120 disclosed in this embodiment is only exemplary, and other circuits may also be adopted to form a TC 120 to achieve the same effect as that described above.

Referring to FIG. 2, a WBR 110 may include: a third data selector 230, a second register 240 and a fourth data selector 250.

The third data selector 230 may include a first input configured to receive the initial test signal. The initial test signal may be transmitted directly from an external test instrument (when the WBR 110 is the first stage WBR located at the initial end of the boundary test circuit), and may also be transmitted directly from a previous stage WBR via a data transmission channel. In addition, the initial test signal may also be transmitted indirectly from the previous stage WBR via a TC located between the current WBR and the previous stage WBR. The third data selector 230 may include a control I/O configured to receive a Hold signal. The Hold signal may be configured to control the WBR 110 to enter or exit a Hold mode, thereby selecting an input signal from different inputs of the third data selector 230.

The second register 240 may have an input connected to an output of the third data selector 230, and configured to receive an output signal from the third data selector 230 after the third data selector 230 selects an input for receiving an input signal. The second register 240 may further include an output configured to output the initial test signal stored thereon. The initial test signal may be output to a TC 120, as shown in FIG. 2, and may also be directly transmitted to a WBR at a succeeding stage through a data transmission channel. Additionally, the second register 240 may receive a CLK signal, under the control of which the initial test signal may be output.

The fourth data selector 250 may include a first input configured to receive a normal input signal (Normal Input), and a second input connected to the output of the second register 240 and configured to receive a signal output by the second register 240. The fourth data selector 250 may further include a control I/O configured to receive a Scan signal, which may be configured to control a WBR 110 to enter or exit a Scan mode, thereby selecting an input signal from different inputs of the fourth data selector 250. The fourth data selector 250 may further include an output configured to transmit a normal output signal (Normal Output). The output of the fourth data selector 250 may be further connected to the second input of the third data selector 230, so that the Normal Output signal may be transmitted to the third data selector 230 and be selected by the third data selector 230.

It is to be noted that the compositional components of a WBR 110 provided by this embodiment is exemplary only, and other circuits may also be adopted to form a WBR 110 to achieve the same effect as that described above.

Figure 3:
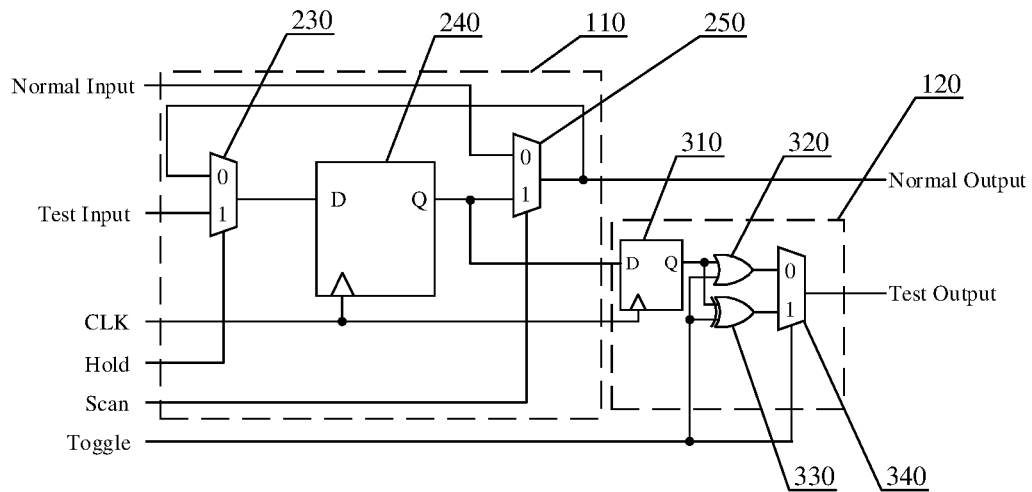
FIG. 3 is a schematic diagram of a part of a boundary test circuit in accordance with one embodiment of this inventive concept.

FIG. 3 is a schematic diagram of a part of a boundary test circuit in accordance with one embodiment of this inventive concept. Referring to FIG. 3, in some embodiments, a TC 120 may include a first register 310, an OR gate 320, an XOR gate 330 and a second data selector 340.

The first register 310 may include an input configured to receive the initial test signal stored in a corresponding WBR 110. Additionally, the first register 310 may receive a CLK signal, under the control of which the initial test signal may be output.

In some embodiments, the TC 120 and the WBR 110 may share the same CLK, as shown FIG. 1 (in a dotted line connecting the CLK signal and the TC 120). In some embodiments, the TC 120 and the WBR 110 may have different CLK signals. Detail implementation is not specially limited in this disclosure.

The OR gate 320 may include a first input connected to an output of the first register 310, and configured to receive the initial test signal stored in the first register 310. The OR gate 320 may further include a second input configured to receive a toggle signal.

The XOR gate 330 may include a first input connected to the output of the first register 310, and configured to receive the initial test signal stored in the first register 310. The XOR gate 330 may further include a second input configured to receive the toggle signal.

The second data selector 340 may include a first input connected to an output of the OR gate 320 and configured to receive a signal output by the OR gate 320. The second data selector 340 may further include a second input connected to an output of the XOR gate 330 and configured to receive a signal output from the XOR gate 330. The second data selector 340 may further include a control I/O configured to receive the toggle signal, which may control a state selection of the second data selector 340. The second data selector 340 may further include an output configured to transmit a real-time test signal, which may be selected, based on the toggle signal received from the control I/O, from one of the two inputs of the second data selector 340.

For example, when the toggle signal is a first signal (e.g., a high level), the second data selector 340 may select the signal at the second input, thus the real-time test signal output at the output of the second data selector 340 may have a phase that is inverse to the phase of the initial test signal. When the toggle signal is a second signal (e.g., a low level), the second data selector 340 may select the signal at the first input, thus the real-time test signal output at the output of the second data selector 340 may have a phase that is identical to the phase of the initial test signal.

In this embodiment, the compositional components of a WBR 110 may be the same as those described in details in the WBRs 110 in the aforementioned embodiments, and thus will not be repeated herein. The compositional components of a TC 120 in this embodiment may be exemplary only, and other circuits may also be adopted to form the TCs 120 to achieve the same effect as those described above.

This inventive concept further provides a memory having a boundary test circuit. The boundary test circuit may be the boundary test circuit in any of the aforementioned embodiments, and may be configured to test the memory. Relevant composition and test principles of the boundary test circuit in this embodiment may be the same as those described in details in the aforementioned embodiments, and thus will not be repeated herein.

This inventive concept further provides a boundary test method based on the boundary test circuit or the memory in the aforementioned embodiments. The method may be configured for testing an integrated circuit.

Figure 4:
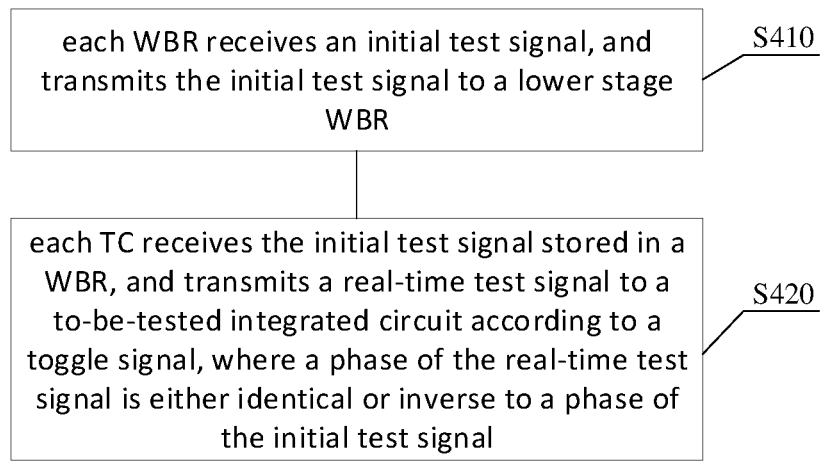
FIG. 4 is a flowchart of a boundary test method in accordance with one embodiment of this inventive concept.

FIG. 4 is a flowchart of a boundary test method in accordance with one embodiment of this inventive concept. Referring to FIG. 4, the method may include the following steps S410 and S420.

In step S410, each WBR may receive an initial test signal, and transmit the initial test signal to a WBR at a succeeding stage.

In this step, a boundary test circuit may first be set to be in a Scan mode using a Scan signal. Controlled by a plurality of control signals described in the aforementioned embodiments, the initial test signal may be transmitted to each WBR stage by stage. Then, the boundary test circuit may be set in a Hold mode using a Hold signal.

In step S420, each TC may receive the initial test signal stored in a corresponding WBR, and transmit a real-time test signal to a to-be-tested integrated circuit based on a toggle signal. The real-time test signal may have a phase that is either identical or inverse to a phase of the initial test signal.

In this step, under the control of the toggle signal, each TC may transmit the real-time test signal to the to-be-tested integrated circuit. The real-time test signal may have a phase that is either identical or inverse to the phase of the initial test signal. In other words, each TC may send an original signal or an inverse signal to the to-be-tested integrated circuit at different clock cycles. For example, when the toggle signal is a first signal (e.g., a high level), a signal having a phase identical to a phase of the initial test signal may be sent to the to-be-tested integrated circuit. When the toggle signal is a second signal (e.g., a low level), a signal having a phase inversed to the phase of the initial test signal may be sent to the to-be-tested integrated circuit.

In the boundary test method provided by the embodiments of this inventive concept, under the control of the toggle signal, the state switching (phase switching) can be performed by each TC on a real-time test signal output from each WBR. Under the control of related control signals, either an original test signal or a test signal with inversed phase may be output to the to-be-tested integrated circuit at different clock cycles. Therefore, the boundary test circuit can provide improved test efficiency and test flexibility.

Other embodiments of this inventive concept will be apparent to those skilled in the art based on the specification and practice of the embodiments disclosed here. This disclosure is intended to cover any variations, uses, or adaptations of this inventive concept following the general principles thereof and including such departures from this inventive concept as come within known or customary practice in the art. It is intended that the specification and embodiments be considered as exemplary only, with a true scope and spirit of this inventive concept being indicated by the appended claims.

The invention claimed is:

1. A boundary test circuit for testing an integrated circuit, comprising:
   a plurality of serially-connected wrapper boundary registers (WBRs), each WBR comprising a first I/O for receiving an initial test signal, and a second I/O for transmitting the initial test signal to the WBR at a succeeding stage; and
   a plurality of toggle circuits (TCs), wherein each TC is connected to a corresponding WBR of the plurality of WBRs, and each TC comprises:
   a first register, comprising a first input for receiving the initial test signal stored in the corresponding WBR and a second input for receiving a CLK signal for controlling the initial test signal;

an OR gate, comprising a first input connected to an output of the first register, and a second input for receiving a toggle signal;

an XOR gate, comprising a first input connected to the output of the first register, and a second input for receiving the toggle signal; and a second data selector, comprising a first input connected to an output of the OR gate, a second input connected to an output of the XOR gate, a control I/O for receiving the toggle signal, and an output for transmitting a real-time test signal to the integrated circuit according to the toggle signal, wherein each WBR comprises a second register having an input for receiving the CLK signal, and wherein a phase of the real-time test signal is either identical or inverse to a phase of the initial test signal.

2. The circuit of claim 1, wherein the toggle signal is configured to switch the phase of the real-time test signal.

3. The circuit of claim 1, wherein each TC is configured to transmit the real-time test signal under the control of the CLK signal.

4. The circuit of claim 1, wherein each WBR further comprises:

a third data selector, comprising a first input for receiving the initial test signal, and a control I/O for receiving a Hold signal, wherein the second register comprises an input connected to an output of the third data selector, and an output for outputting the initial test signal stored in the second register; and a fourth data selector, comprising a first input for receiving a Normal input, a second input connected to the output of the second register, a control I/O for receiving a Scan signal, and an output for transmitting the Normal output, and the output of the fourth data selector being connected to a second input of the third data selector.

5. The circuit of claim 4, wherein each WBR is configured to transmit the initial test signal under the control of the CLK signal.

6. The circuit of claim 1, wherein the integrated circuit is a memory.

7. A boundary test method for testing an integrated circuit, comprising:

receiving, by each wrapper boundary register (WBR) in a plurality of serially-connected WBRs, an initial test signal, wherein each WBR comprises a first I/O for receiving the initial test signal, and a second I/O for transmitting the initial test signal to the WBR at a succeeding stage; and receiving, by each toggle circuit (TC) in a plurality of TCs, the initial test signal stored in a corresponding WBR of the plurality of WBRs, wherein each TC is connected to a corresponding WBR of the plurality of WBRs, and each TC comprises:

a first register, comprising a first input for receiving the initial test signal stored in the corresponding WBR and a second input for receiving a CLK signal for controlling the initial test signal;

an OR gate, comprising a first input connected to an output of the first register, and a second input for receiving a toggle signal;

an XOR gate, comprising a first input connected to the output of the first register, and a second input for receiving the toggle signal; and a second data selector, comprising a first input connected to an output of the OR gate, a second input connected to an output of the XOR gate, a control I/O for receiving the toggle signal, and an output for transmitting a real-time test signal to the integrated circuit according to the toggle signal, wherein each WBR comprises a second register having an input for receiving the CLK signal, and wherein a phase of the real-time test signal is either identical or inverse to a phase of the initial test signal.

8. The method of claim 7, wherein the toggle signal is configured to switch the phase of the real-time test signal.

9. The method of claim 7, wherein each TC is configured to transmit the real-time test signal under the control of the CLK signal.

10. The method of claim 7, wherein each WBR is configured to transmit the initial test signal under the control of the CLK signal.

11. The method of claim 7, wherein each WBR further comprises:

a third data selector, comprising a first input for receiving the initial test signal, and a control I/O for receiving a Hold signal, wherein the second register comprises an input connected to an output of the third data selector, and an output for outputting the initial test signal stored in the second register; and a fourth data selector, comprising a first input for receiving a Normal input, a second input connected to the output of the second register, a control I/O for receiving a Scan signal, and an output for transmitting the Normal output, and the output of the fourth data selector being connected to a second input of the third data selector.

12. The method of claim 11, wherein each WBR is configured to transmit the initial test signal under the control of the CLK signal.

13. The method of claim 7, wherein the integrated circuit is a memory.

* * * * *